United States Patent [19]

Vera et al.

[11] Patent Number: 4,890,150
[45] Date of Patent: Dec. 26, 1989

[54] DIELECTRIC PASSIVATION

[75] Inventors: Eduardo S. Vera, New York; Edward H. Stupp, Spring Valley, both of N.Y.

[73] Assignee: North American Philips Corporation, New York, N.Y.

[21] Appl. No.: 805,500

[22] Filed: Dec. 5, 1985

[51] Int. Cl.$^4$ .......................................... H01L 29/34
[52] U.S. Cl. ..................................... 357/52; 357/23.8; 358/213.11; 365/185
[58] Field of Search ....................... 357/52, 23.4, 23.6; 365/168, 185; 358/213

[56] References Cited

U.S. PATENT DOCUMENTS

| | | | |
|---|---|---|---|
| 4,494,134 | 1/1985 | Wildi et al. | 357/38 |
| 4,609,929 | 2/1986 | Jararaman et al. | 357/23.4 |
| 4,612,629 | 9/1986 | Harari | 357/23.6 |
| 4,639,761 | 1/1987 | Singer et al. | 357/23.4 |

Primary Examiner—Robert S. Macon
Attorney, Agent, or Firm—Paul R. Miller

[57] ABSTRACT

A high-voltage semiconductor device is set forth having a passivation scheme able to shelter the device from both external charges and internal charges. In particular, the distribution of electric fields in the device is altered to make it less vulnerable to the presence of internal charges.

10 Claims, 5 Drawing Sheets

DIELECTRIC PASSIVATION

The present invention is directed to the provision of a stable high-voltage device which is less sensitive to the presence of both external and internal charges.

In the development of high-voltage integrated circuits, an important factor is the fabrication of high-voltage lateral devices that make efficient use of the device surface area. A successful approach that has been developed is the RESURF (REduced SURface Field) method. A particular choice of doping concentration and epitaxial thickness of the semiconductor layers produces a strong reduction of the surface field in this technique. Consequently, the voltage range at which these devices can safely operate increases.

In the instance of a simple diode structure, such as seen in FIG. 1a, it is possible to increase the breakdown voltage VB with thick epitaxial layers. Such, thick epitaxial layers 2 on the substrate 1 in FIG. 1b provides a breakdown voltage of 370 volts. A reduction in surface field in the structure further results in obtaining an ideal RESURF condition (constant electric field along nearly the complete device surface) as seen in FIG. 1c. The breakdown voltage is increased to 1150 volts with a nearly constant surface field.

For other less symmetric structures, such as in the case of geometrical irregularities, the electric field in the vicinity of such irregularities departs from a constant value. Another major difficulty exists in fabrication because of great sensitivity of such structures to the presence of both external and internal charges. The presence of such charges adversely effects the electrical properties of high-voltage transistors and produces regions of large electrical potential gradient with consequently low avalanche breakdown voltages.

Conventional techniques of protecting semiconductor devices have been used, but these conventional passivation schemes only shelter the device from contamination or external charges. Such conventional passivations schemes have little or no influence on the effect that internal charges in the device have on the device electric field distribution. These conventional passivation schemes consist of adding at least one layer of a material over the entire device area such as by SIPOS techniques, by use of a plasma nitride, by use a plasma oxide, by use of a low temperature oxide, etc. Some of these materials furthermore exhibit finite electrical conductivity, such as the SIPOS devices, which make them less suited as passivation layers because of the high power dissipation and larger gate to drain leakage current that can arise.

The present invention relates to a passivation scheme which not only shelters the device from external charges, but also alters the distribution of electric fields in the device to make it less vulnerable to the presence of internal charges. This tends to enhance the RESURF action by making the electric field distribution in the device even more constant and less sensitive to the effects of non-ideal geometries which occur in real devices.

The present invention involves placing a layer of a very high dielectric material having a dielectric coefficient of at least 80 ($\epsilon$ greater than 80) as an active structure over the field oxide layer.

Thus, the present invention involves using non-conductive dielectric material as an active passivation layer which shelters the device from electrical charges while also reducing the electric fields on its surface.

The structure and features of the present invention may be understood by reference to the drawing features which illustrate without limitation an embodiment of the present invention, and wherein:

FIGS. 1a, 1b, and 1c illustrate prior art variations in the cross section of a RESURF diode;

FIG. 2b illustrates an enlarged view of the high dielectric layer according to the present invention in FIG. 2a;

FIG. 4b illustrates an enlarged view of the surface region of FIG. 4a;

Figure 6:
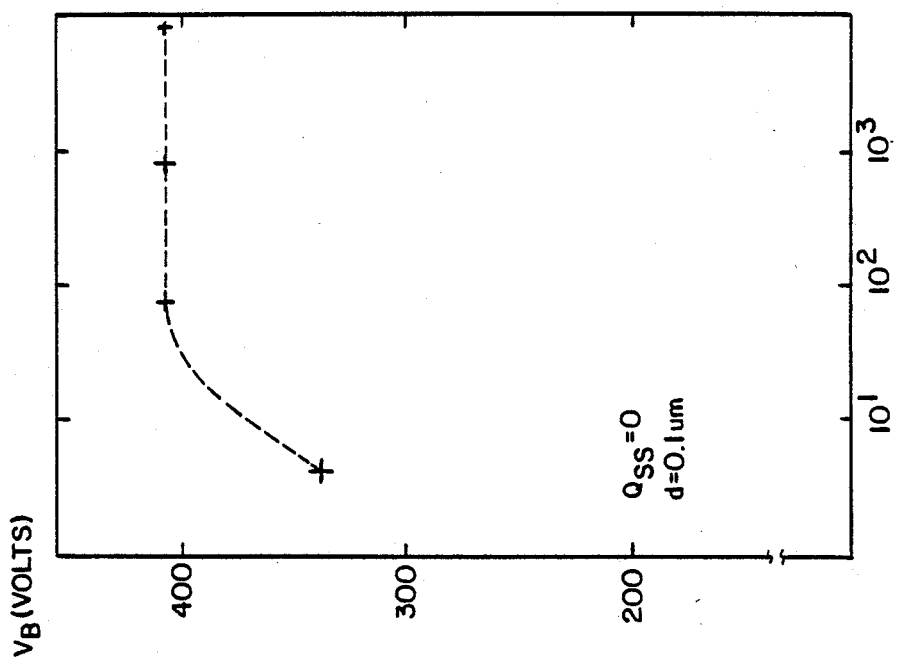
Figure 5:
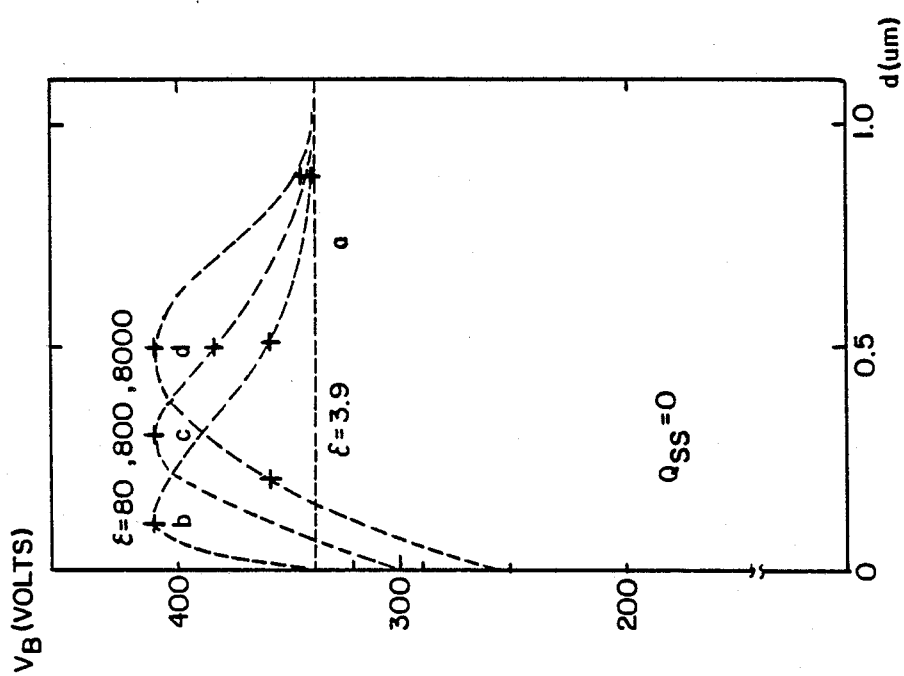
Figure 7:
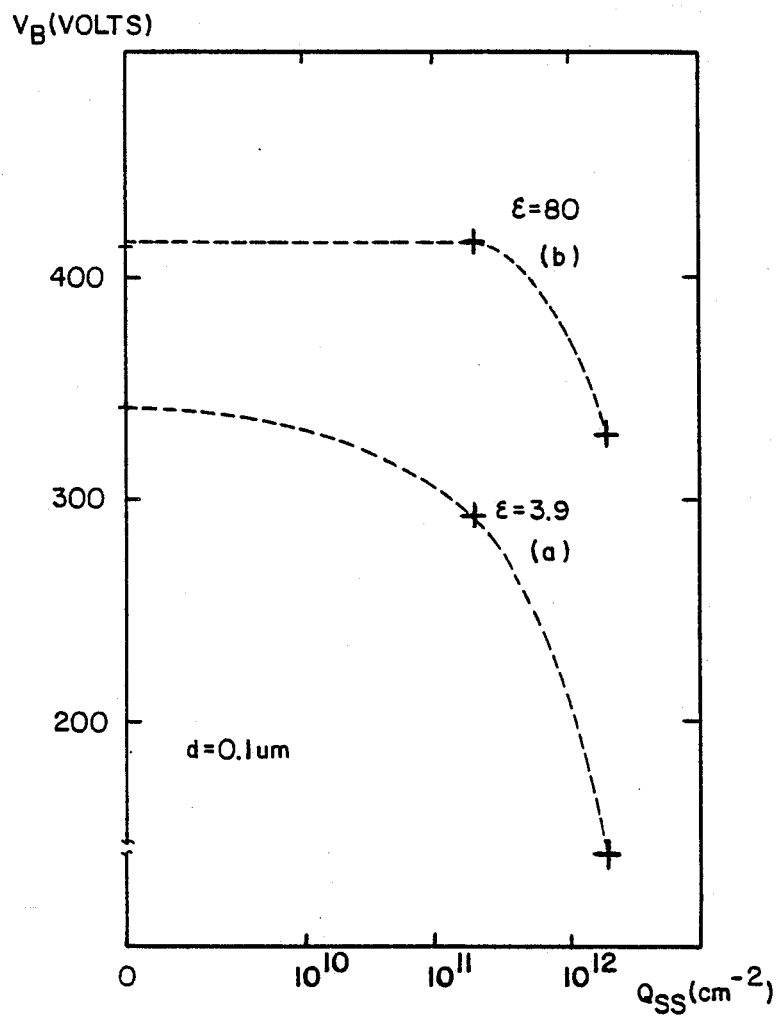

FIG. 5 provides a graphic illustration of the breakdown voltage versus distance from the surface;

FIG. 6 provides a graphic illustration of the breakdown voltage versus the static dielectric constant; and FIG. 7 provides a graphic illustration of the breakdown voltage versus interface charge density according to the present invention.

Figure 1A:
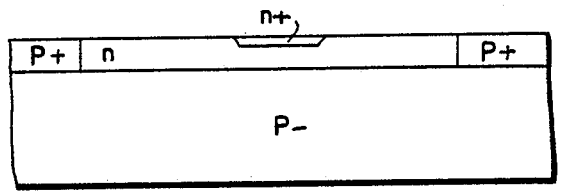
Figure 1B:
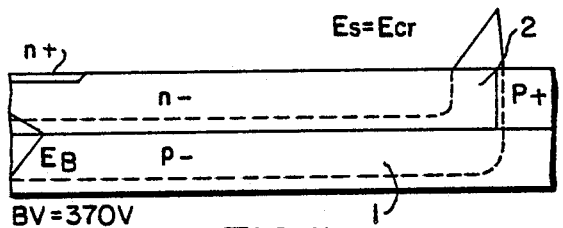
Figure 1C:
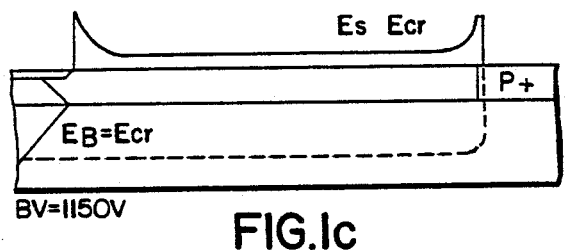
Figure 2B:
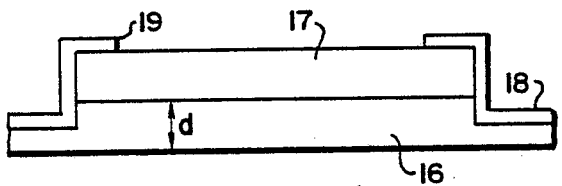
Figure 2A:
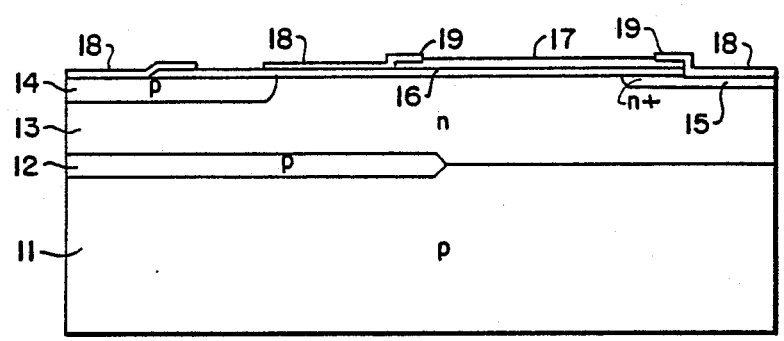
FIG. 2a illustrates a cross sectional view of a LDMOST high-voltage structure according to the present invention with a passivating layer of a high dielectric material.

The present invention is explained with reference to a RESURFed LDMOST device, as illustrated in FIG. 2. This device includes a silicon substrate 11 of a first conductivity type, a buried layer 12 of the same conductivity type but of a higher doping at the surface of the substrate 11, an epitaxial layer 13 of a second opposite conductivity type on the substrate 11 and buried layer 12, a surface layer 14 of the first conductivity type, and a surface layer 15 of the second conductivity type but having a higher doping as shown in FIG. 2a. Each of these layers may be appropriately doped layers of silicon.

An insulating layer 16 of $SiO_2$ is provided over a portion of the surface of the epitaxial layer 13 and the surface layers 14 and 15. On the insulating layer 16 a layer of a high dielectric material 17 is provided as a passivation layer over a portion of both the epitaxial layer 13 and surface layer 15. An example of this passivation layer 17 is titanium dioxide ($TiO_2$) with a large static dielectric constant of approximately one order of magnitude larger than the dielectric constant of passivation materials commonly used. An electrode 18 of aluminum is provided at the surface of the device covering a small portion 19 of the edges of the high dielectric material 17.

Figure 3:
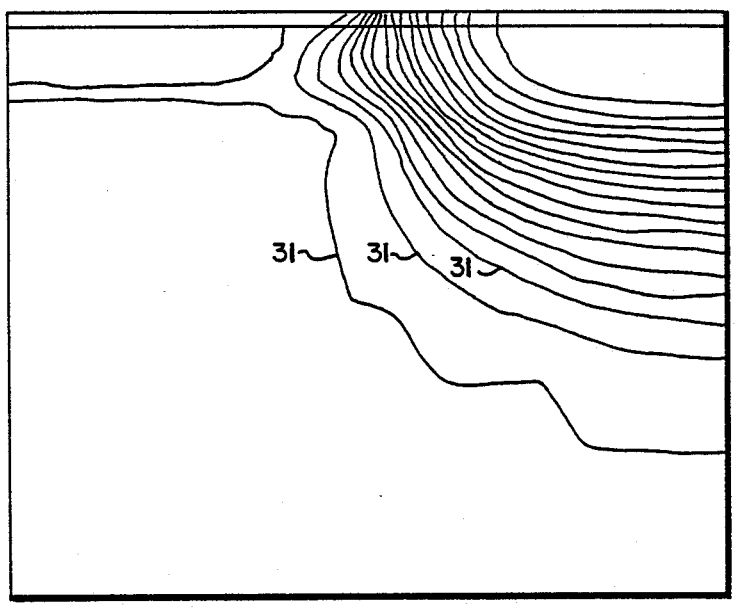
FIG. 3 illustrates the electrical equipotential contours for a device according to the prior art.
Figure 4B:
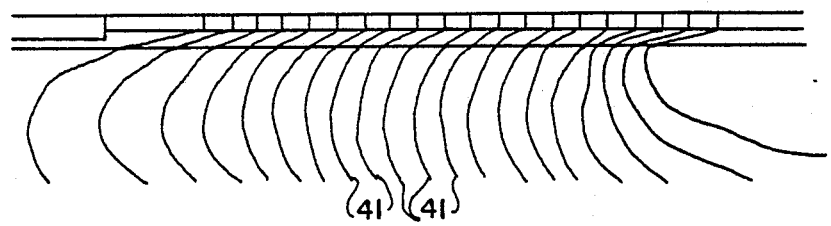
Figure 4A:
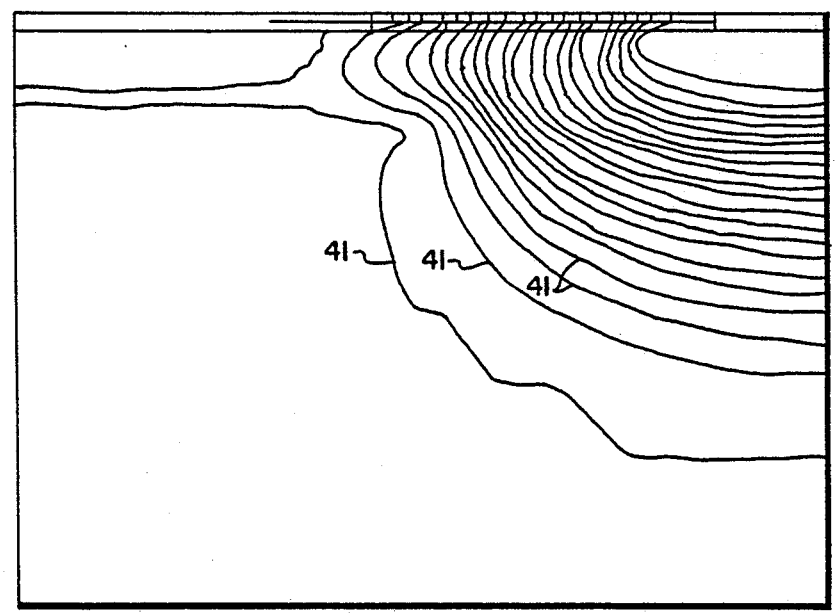
FIG. 4a illustrates the electrical equipotential contours of a device having a high dielectric layer according to the present invention.

This structure may be further understood by reference to the graphical representations. For instance, FIG. 3 provides a graphical illustration of the potential distribution in a LDMOST being made according to the prior art that has a passivation layer with a low dielectric constant value in comparison with the present invention. The electric equipotential contours 31 in FIG. 3 (41 in FIG. 4) have intervals of 20 volts. FIG. 4, on the other hand, modifies the potential distribution illustrated in FIG. 3 by the introduction of the high dielectric constant passivation layer 17, such as shown in FIG. 2. The effect of this high dielectric passivation layer become similar to that of an ohmic material although its origin is different. These materials are better suited layers under switching conditions and in addition will exhibit negligible gate to drain leakage. The electric equipotential contours 41 in FIG. 4 are provided for a high-voltage LDMOST structure with a dielectric layer having a dielectric constant of approximately 80. The breakdown voltage in this case would be approximately 412 volts, whereas the breakdown voltage for the conventional structure illustrated in FIG. 3 without the high dielectric constant passivating layer according to the present invention would be approximately 339 volts.

The breakdown voltage is further illustrated as a function of the distance from the dielectric layer to the surface for the high-voltage LDMOST structure having passivating layers. The distance d from the dielectric layer 17 to the surface of the epitaxial layer 13 as illustrated in FIG. 2b, is 0.1 micron, which is an optimum for the $TiO_2$ passivation layer. The thickness of the passivation layer 17 is preferably 1 micron. FIG. 5 illustrates the conditions of passivating layers of low dielectric constant of (a) 3.9 [prior art], and high dielectric constants, such as (b) 80, (c) 800, and (d) 8000 [present invention].

FIG. 6 illustrates the breakdown voltage as a function of the static dielectric constant $\epsilon$ of the passivating layer for a high-voltage LDMOST structure. FIG. 7 illustrates the breakdown voltage as a function of the interface charge density $Q_{ss}$ for a high-voltage LDMOST structure having passivating layers of (a) low dielectric constant of the prior art of approximately 3.9, and (b) high dielectric constant of the present invention of about 80. This illustrates that the structure of FIG. 2 would be much less sensitive to internal charges. FIGS. 5 and 6 emphasize that the more linear potential gradient according to the present invention results in a higher breakdown voltage with about a 20% increase in breakdown voltage.

The present invention is also applicable to other semiconductor devices, such as bi-polar transistors.

What we claim:

1. A semiconductor device comprising a substrate layer of a first conductivity type, an epitaxial layer of a second conductivity type overlying said substrate layer, an insulator layer covering at least a portion of said epitaxial layer, and a passivating layer of a high dielectric constant on said insulating layer, said high dielectric constant being at least approximately 80.

2. A semiconductor device according to claim 1, wherein said passivating layer has a thickness of approximately 1 micron.

3. A semiconductor device according to claim 1 or claim 2, wherein said passivating layer is $TiO_2$.

4. A semiconductor device according to claim 1 or claim 2, wherein said passivating layer has a dielectric constant of approximately 80.

5. A semiconductor device comprising a substrate layer of a first conductivity type; an epitaxial layer of a second conductivity type overlying said substrate layer; a buried layer lying between a portion of said substrate layer and said epitaxial layer, said buried layer having a higher doping of said first conductivity type; a first surface layer of said first conductivity type at a portion of said epitaxial layer above said buried layer; a second surface layer of said second conductivity type at another portion of said epitaxial layer free from said buried layer; an insulating layer over a portion of said epitaxial layer and said first and second surface layers; a passivating layer of a high dielectric constant on a portion of said insulating layer; and an electrode layer on at least portions of said insulating layer and edges of said passivating layer.

6. A semiconductor device according to claim 5, wherein said passivating layer has a thickness of approximately 1 micron.

7. A semiconductor device according to claim 5 or claim 6, wherein said passivating layer is $TiO_2$.

8. A semiconductor layer according to claim 5 or claim 6, wherein said passivating layer has a dielectric constant of approximately 80.

9. A semiconductor device according to claim 1 or claim 2, wherein said passivating layer has a dielectric constant of approximately one of 800 or 8000.

10. A semiconductor device according to claim 5 or claim 6, wherein said passivating layer has a dielectric constant of approximately one of 800 or 8000.

* * * * *